United States Patent
Shih et al.

(10) Patent No.: US 10,115,594 B1
(45) Date of Patent: Oct. 30, 2018

(54) METHOD OF FORMING FINE ISLAND PATTERNS OF SEMICONDUCTOR DEVICES

(71) Applicant: NANYA TECHNOLOGY CORPORATION, New Taipei (TW)

(72) Inventors: Shing-Yih Shih, New Taipei (TW); Chiang-Lin Shih, New Taipei (TW); Chih-Ching Lin, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/695,027

(22) Filed: Sep. 5, 2017

(51) Int. Cl.
  *H01L 21/33* (2006.01)
  *H01L 21/033* (2006.01)
(52) U.S. Cl.
  CPC ...... *H01L 21/0338* (2013.01); *H01L 21/0335* (2013.01); *H01L 21/0337* (2013.01)
(58) Field of Classification Search
  CPC ............. H01L 21/0338; H01L 21/0335; H01L 21/0337
  See application file for complete search history.

(56) References Cited

U.S. PATENT DOCUMENTS

| | | | |
|---|---|---|---|
| 8,298,943 B1 * | 10/2012 | Arnold | H01L 21/0337 438/667 |
| 9,159,560 B2 | 10/2015 | Seo | |
| 2008/0305636 A1 * | 12/2008 | Kim | H01L 21/0337 438/696 |
| 2012/0329268 A1 * | 12/2012 | Soda | H01L 21/0337 438/631 |
| 2015/0155198 A1 | 6/2015 | Tsai et al. | |

* cited by examiner

*Primary Examiner* — Su C Kim
(74) *Attorney, Agent, or Firm* — CKC & Partners Co., Ltd.

(57) ABSTRACT

A method of forming fine island patterns of semiconductor devices includes: forming a plurality of first mask pillars on a hard mask layer on a substrate; forming an upper buffer mask layer on the hard mask layer to cover the first mask pillars; patterning a plurality of islands in the upper buffer mask layer; separating each of the islands into a plurality of sub-islands; etching the upper buffer mask layer to form a plurality of second mask pillars on the hard mask layer; etching an exposed portion of the hard mask layer exposed by the first mask pillars and the second mask pillars until portions of the substrate are etched; and removing the first mask pillars, the second mask pillars, and remaining portions of the hard mask layer.

15 Claims, 9 Drawing Sheets

METHOD OF FORMING FINE ISLAND PATTERNS OF SEMICONDUCTOR DEVICES

BACKGROUND

Technical Field

The present disclosure relates to a method of forming fine island patterns of semiconductor devices.

Description of Related Art

As the degree of integration of semiconductor devices increases, various double patterning technologies for forming fine island patterns having a pitch or a diameter smaller than the minimum resolution of a photolithography process have been developed.

In general, there are two major double patterning techniques (DPT): Litho-Etch-Litho-Etch (LELE) Double Patterning technique and Self-Aligned Double Patterning (SADP) technique. LELE is much more mature than SADP in terms of process development and design flow implementation, while SADP has stronger scaling potential than LELE due to its smaller design rules on tip-tip and tip-side as well as its intrinsic self-align property.

SUMMARY

An aspect of the disclosure is to provide a method of forming fine island patterns of semiconductor devices.

According to an embodiment of the disclosure, the method of forming fine island patterns includes: forming a plurality of first mask pillars on a hard mask layer on a substrate; forming an upper buffer mask layer over the hard mask layer to cover the first mask pillars; patterning a plurality of islands in the upper buffer mask layer; separating each of the islands into a plurality of sub-islands; etching the upper buffer mask layer to form a plurality of second mask pillars on the hard mask layer; etching an exposed portion of the hard mask layer exposed by the first mask pillars and the second mask pillars until portions of the substrate are etched; and removing the first mask pillars, the second mask pillars, and remaining portions of the hard mask layer.

In an embodiment of the disclosure, vertical projections of the islands on the hard mask layer are located among the first mask pillars.

In an embodiment of the disclosure, the forming the first mask pillars includes forming the first mask pillars based on a matrix constituting of a first dimension and a second dimension.

In an embodiment of the disclosure, the forming the first mask pillars includes equidistantly forming the first mask pillars based on the matrix.

In an embodiment of the disclosure, the patterning the islands includes patterning the islands based on a matrix constituting of the first dimension and a third dimension, in which vertical projections of the islands on the hard mask layer and the first mask pillars are arranged along the first dimension and the third dimension.

In an embodiment of the disclosure, an angle between the first and second dimensions is about 60 degrees. An angle between the first and third dimensions is about 90 degrees.

In an embodiment of the disclosure, the separating includes making the sub-islands of each of the islands be arranged along the third dimension.

In an embodiment of the disclosure, a distance between adjacent two of the first mask pillars arranged along the third dimension is greater than a distance between adjacent two of the first mask pillars arranged along the first dimension.

In an embodiment of the disclosure, the forming the first mask pillars includes forming a lower buffer mask layer on the hard mask layer; forming a plurality of through vias in the lower buffer mask layer; filling the through vias with a mask material to form the first mask pillars; and removing the lower buffer mask layer.

In an embodiment of the disclosure, the method further includes forming spacers on inner walls of the through vias before the filling.

In an embodiment of the disclosure, the method further includes removing the spacers after the etching the upper buffer mask layer and before the etching the exposed portion of the hard mask layer.

In an embodiment of the disclosure, the forming the spacers includes forming a first spacer layer on a top surface of the lower buffer mask layer, the inner walls of the through vias, and a top surface of the hard mask layer; and removing portions of the first spacer layer on the top surfaces of the lower buffer mask layer and the hard mask layer to remain portions of the first spacer layer on the inner walls of the through vias.

In an embodiment of the disclosure, the method further includes forming a second spacer layer on the hard mask layer to cover the first mask pillars and the spacers before the forming the upper buffer mask layer.

In an embodiment of the disclosure, the method further includes removing the spacers and the second spacer layer after the etching the upper buffer mask layer and before the etching the exposed portion of the substrate.

In an embodiment of the disclosure, the method further includes performing a planarization process to the first mask pillars with the lower buffer mask layer.

In an embodiment of the disclosure, the forming the upper buffer mask layer is performed by spin-coating.

Accordingly, the method of forming fine island patterns of semiconductor devices of the disclosure can effectively form fine island patterns having a pitch or a diameter smaller than minimum resolution of a photolithography process.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
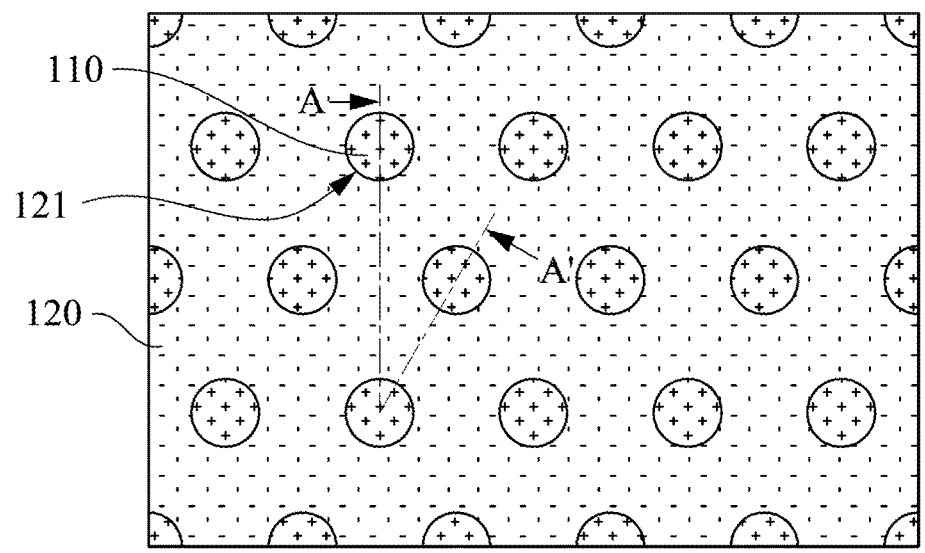
FIGS. 1A, 2A, 3A, 4A, 5A, 6A, 7A, 8A, and 9A are top views illustrating a method of forming fine island patterns of semiconductor devices according to some embodiments of the disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

It will be understood that, if an element is referred to as being "connected" or "coupled" to another element, it can be directly connected, or coupled, to the other element or intervening elements may be present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the disclosure provide a method of forming fine island patterns of semiconductor devices.

Figure 1B:
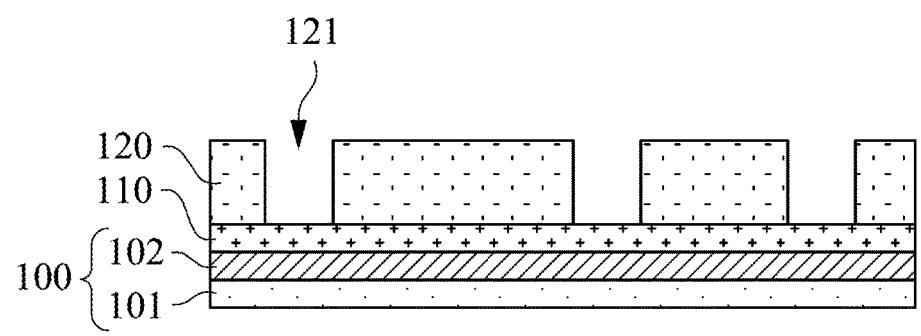
FIGS. 1B, 2B, 3B, 4B, 5B, 6B, 7B, 8B, and 9B longitudinal cross-sectional views taken along line A-A' of FIGS. 1A, 2A, 3A, 4A, 5A, 6A, 7A, 8A, and 9A, respectively.

Reference is made to FIGS. 1A and 1B. In some embodiments, the method of forming fine island patterns may include: forming a hard mask layer 110 on a substrate 100; forming a lower buffer mask layer 120 on the hard mask layer 110; and forming a plurality of through vias 121 in the lower buffer mask layer 120.

In some embodiments, the lower buffer mask layer 120 may include a first lower layer (not shown) disposed on the hard mask layer 110 and a second lower layer (not shown) disposed on the first lower layer. In some embodiments, the first lower layer may include silicon nitride (SiN), silicon monoxide (SiO), silicon oxynitride (SiON), silicon carbide (SiC), etc. In some embodiments, the second lower layer may include SiN, SiO, SiON, SiC, carbon, silicon based material, etc.

Figure 2A:
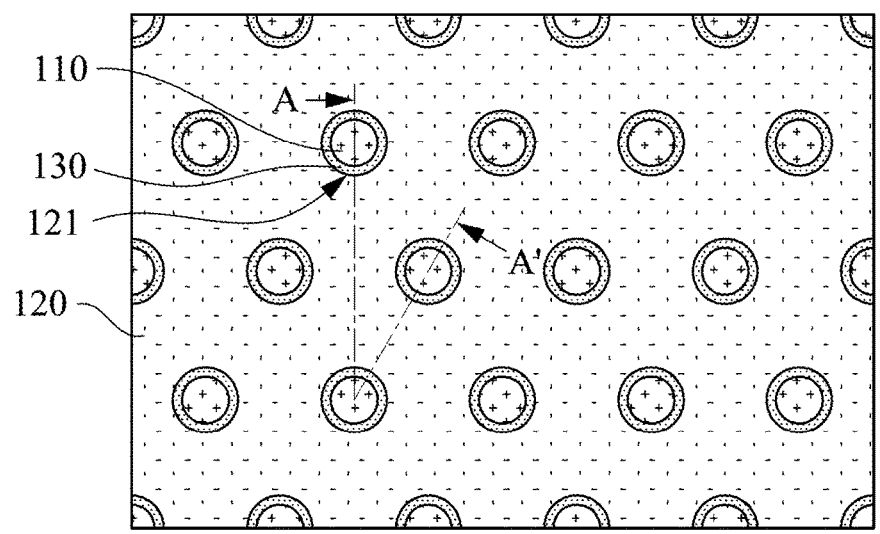
Figure 2B:
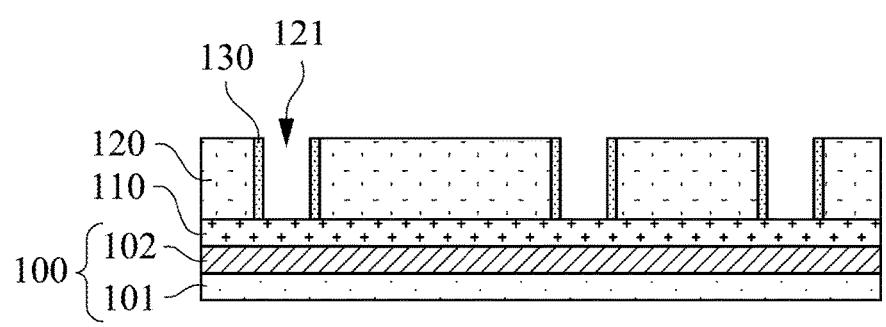

Reference is made to FIGS. 2A and 2B. In some embodiments, the method of forming fine island patterns may further include forming spacers 130 on inner walls of the through vias 121.

In some embodiments, the forming the first spacers 130 may include forming a first spacer layer (not shown) on a top surface of the lower buffer mask layer 120, the inner walls of the through vias 121, and a top surface of the hard mask layer 110; and removing portions of the first spacer layer on the top surfaces of the lower buffer mask layer 120 and the hard mask layer 110 to remain portions of the first spacer layer on the inner walls of the through vias 121. That is, the remaining portions of the first spacer layer on the inner walls of the through vias 121 serve as the spacers 130.

In some embodiments, the forming the first spacer layer may include blanket forming the first spacer layer by Atomic layer deposition (ALD). In some embodiments, the removing the portions of the first spacer layer on the top surfaces of the lower buffer mask layer 120 and the hard mask layer 110 is performed by etching horizontal portions of the first spacer layer.

In some embodiments, the first spacer layer may include SiN, SiO, etc.

Figure 3A:
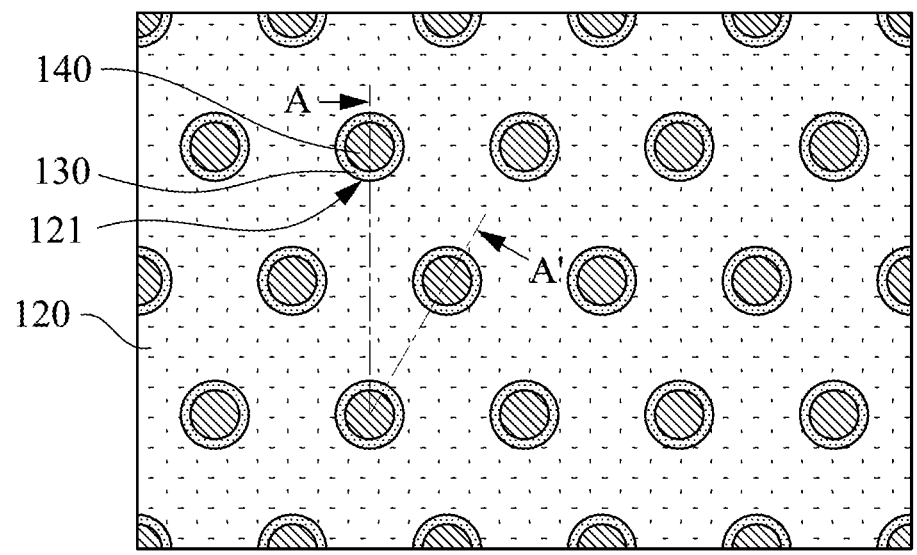
Figure 3B:
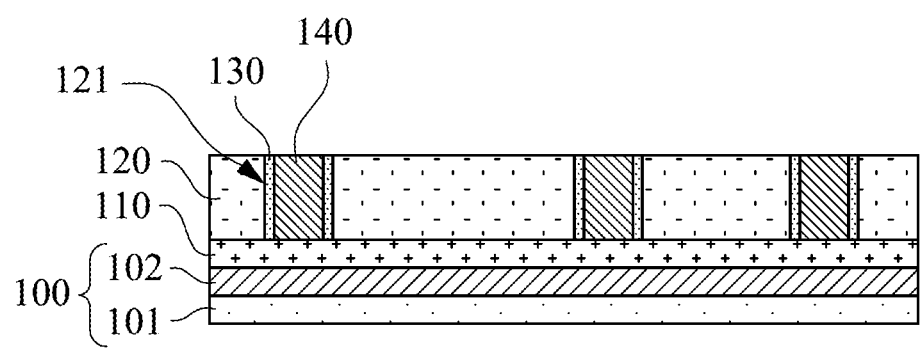

Reference is made to FIGS. 3A and 3B. In some embodiments, the method of forming fine island patterns may further include filling the through vias 121 with a mask material to form a plurality of first mask pillars 140.

In some embodiments, the mask material may include polymers, SiN, SiO, etc.

In some embodiments, the method of forming fine island patterns may include performing a planarization process to the first mask pillars 140 with the lower buffer mask layer 120. In practical applications, the performing the planarization process to the first mask pillars 140 may be performed by an etch back process or chemical-mechanical polishing (CMP).

Figure 4A:
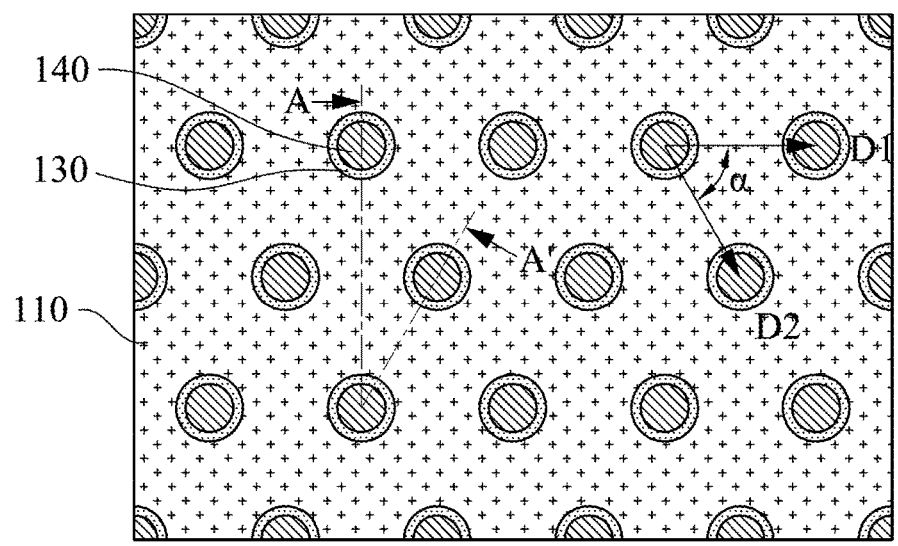
Figure 4B:
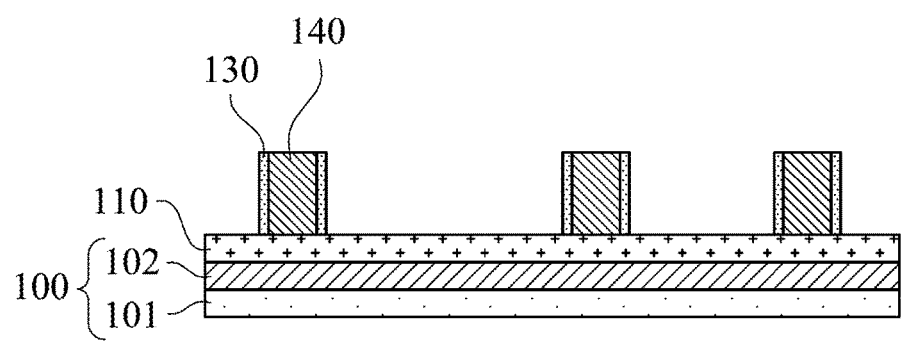

Reference is made to FIGS. 4A and 4B. In some embodiments, the method of forming fine island patterns may further include removing the lower buffer mask layer 120.

Figure 5A:
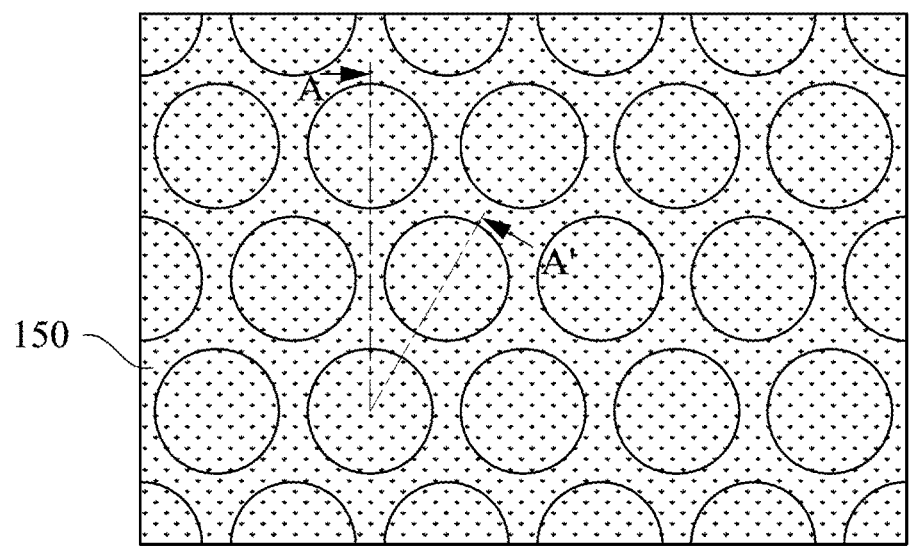
Figure 5B:
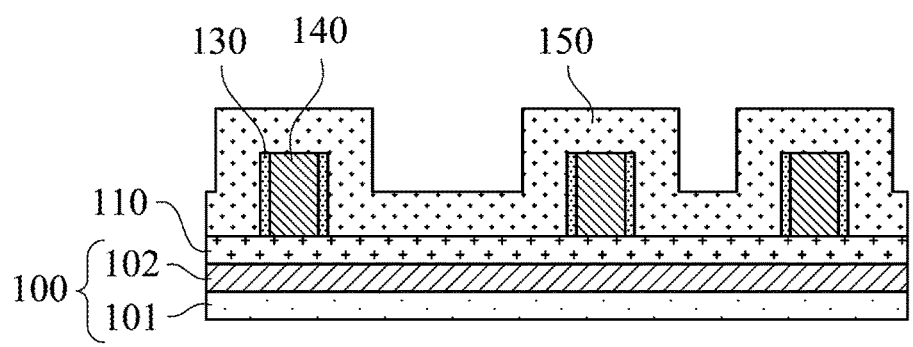

Reference is made to FIGS. 5A and 5B. In some embodiments, the method of forming fine island patterns may further include forming a second spacer layer 150 on the hard mask layer 110 to cover the first mask pillars 140 and the spacers 130.

In some embodiments, the forming the second spacer layer 150 may include blanket forming the second spacer layer 150 by ALD.

In some embodiments, the second spacer layer may include SiN, SiO, etc.

Figure 6A:
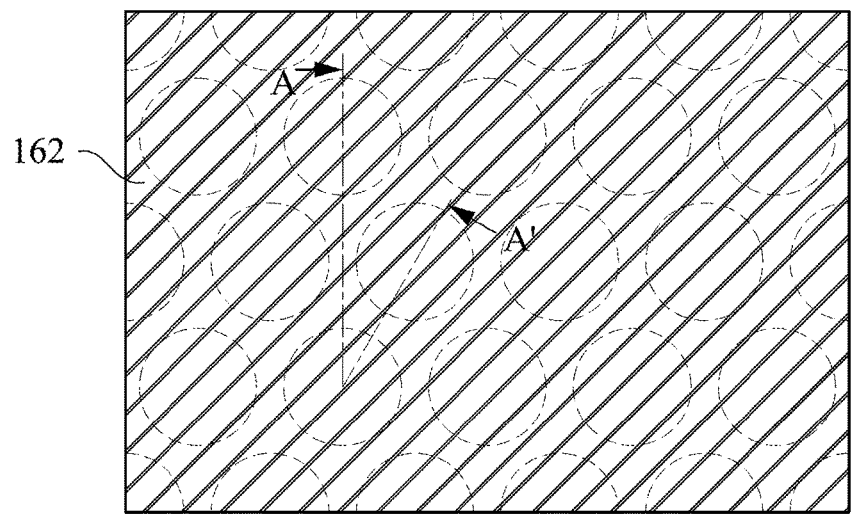
Figure 6B:
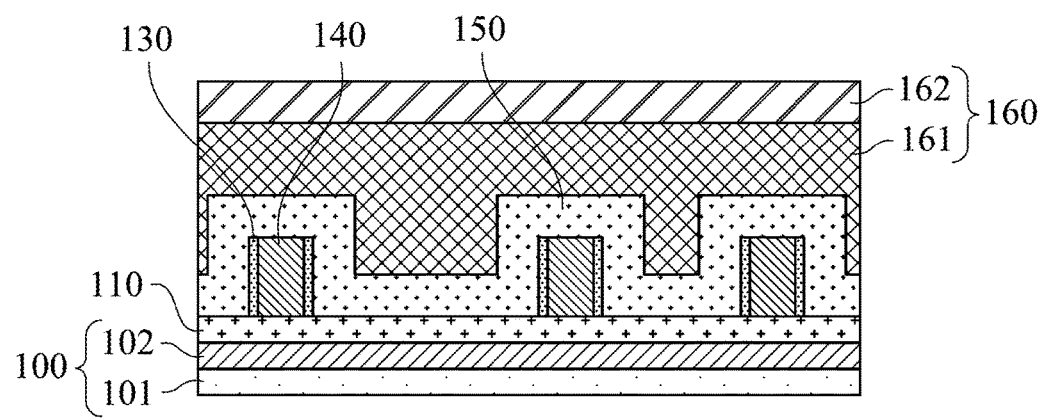

Reference is made to FIGS. 6A and 6B. In some embodiments, the method of forming fine island patterns may further include forming an upper buffer mask layer 160 on the second spacer layer 150. In some embodiments, the forming the second spacer layer 150 may be omitted, and the upper buffer mask layer 160 is formed over the hard mask layer 110 to cover the first mask pillars 140 and the spacers 130. In some embodiments, the forming the spacers 130 may be omitted, and the upper buffer mask layer 160 is formed over the hard mask layer 110 to cover the first mask pillars 140.

In some embodiments, the upper buffer mask layer 160 may include a first upper layer 161 disposed on the second spacer layer 150 and a second upper layer 162 disposed on the first upper layer 161.

In some embodiments, the first upper layer 161 may include SiN, SiO, organic compounds, etc. In some embodiments, the second upper layer 162 may include SiN, SiO, organic compounds, etc.

In some embodiments, the forming the upper buffer mask layer 160 is performed by spin-coating.

Figure 7A:
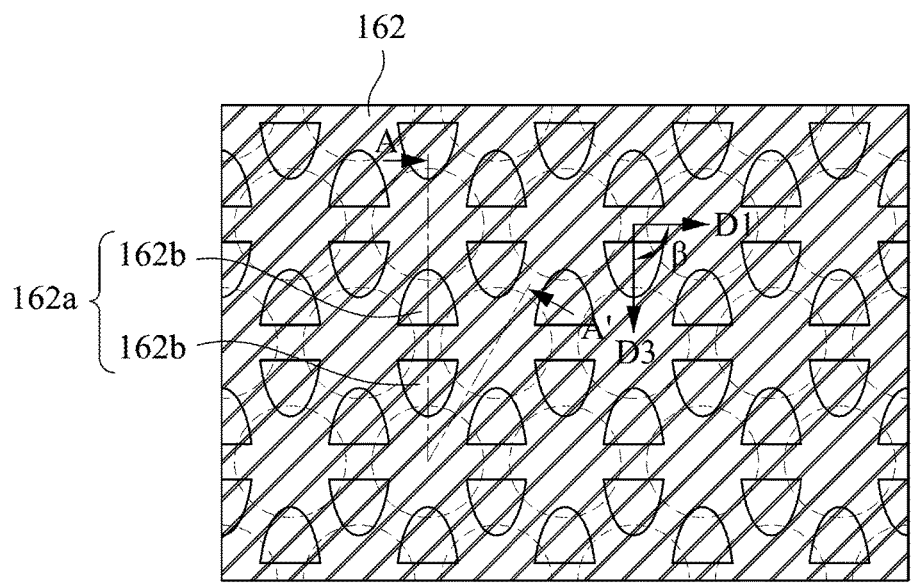
Figure 7B:
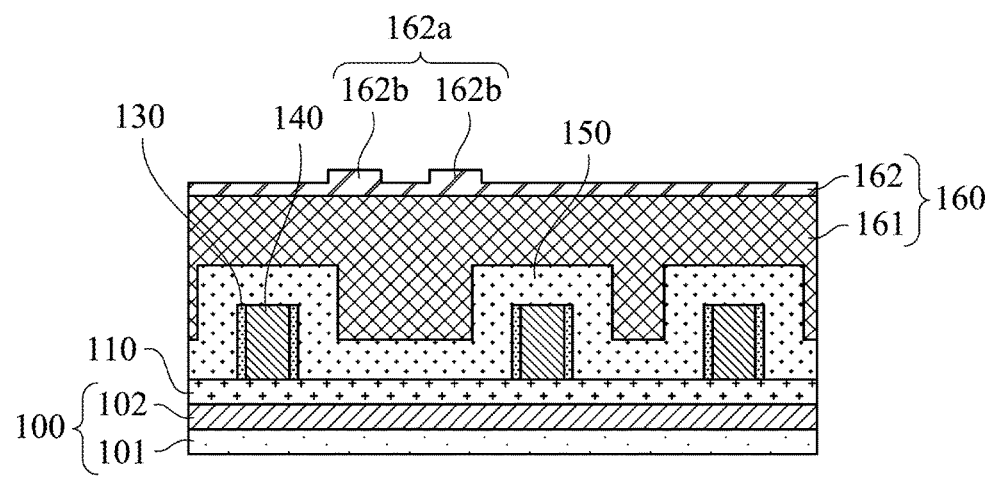

Reference is made to FIGS. 7A and 7B. In some embodiments, the method of forming fine island patterns may further include: patterning a plurality of islands 162a in the upper buffer mask layer 160; and separating each of the islands 162a into a plurality of sub-islands 162b.

In some embodiments, the patterning the islands 162a may be performed by a set of lithography and etching processes. In some embodiments, the separating each of the islands 162a may be performed by another set of lithography and etching processes.

In some embodiments, the number of the sub-islands 162b of each of the islands 162a is two, but the disclosure is not limited in this regard.

In some embodiments, vertical projections of the islands 162a on the hard mask layer 110 are located among the first mask pillars 140. In some embodiments, the vertical projections of the islands 162a partially overlap the second spacer layer 150 (referring to FIGS. 7A and 7B).

In some embodiments, the forming the first mask pillars 140 may include forming the first mask pillars 140 based on a matrix constituting of a first dimension D1 and a second dimension D2 (referring to FIG. 4A).

In some embodiments, the forming the first mask pillars 140 may include equidistantly forming the first mask pillars 140 based on the matrix.

In some embodiments, the patterning the islands 162a may include patterning the islands 162a based on a matrix constituting of the first dimension D1 and a third dimension D3 (referring to FIG. 7A), in which the vertical projections of the islands 162a on the hard mask layer 110 and the first mask pillars 140 are arranged along the first dimension D1 and the third dimension D3.

In some embodiments, an angle α between the first dimension D1 and second dimension D2 is about 60 degrees (referring to FIG. 4A), and an angle β between the first dimension D1 and third dimension D3 is about 90 degrees (referring to FIG. 7A).

In some embodiments, a distance between adjacent two of the first mask pillars 140 arranged along the third dimension D3 is greater than a distance between adjacent two of the first mask pillars 140 arranged along the first dimension D1. In some embodiments, the separating may include making the sub-islands 162b of each of the islands 162a be arranged along the third dimension D3.

Figure 8A:
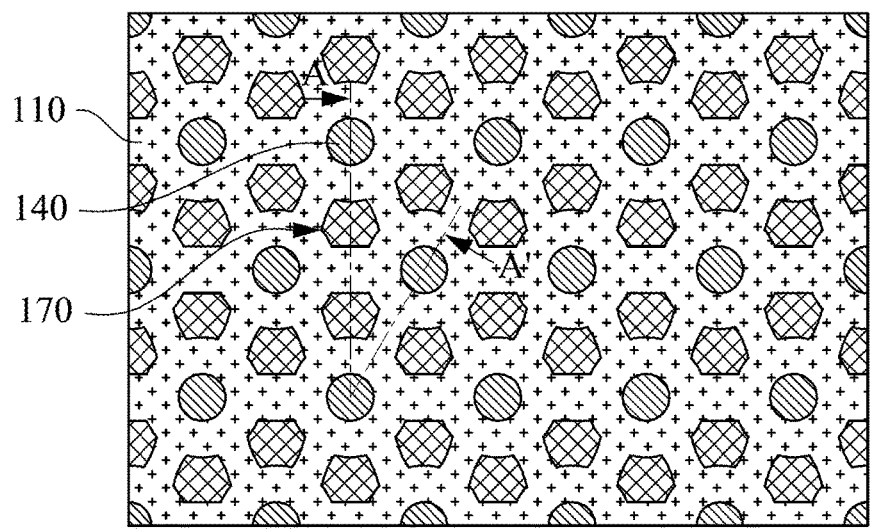
Figure 8B:
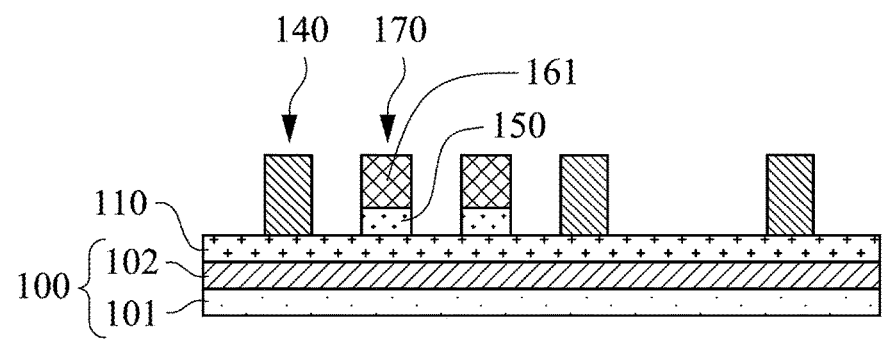

Reference is made to FIGS. 8A and 8B. In some embodiments, the method of forming fine island patterns may further include etching the upper buffer mask layer 160 to form a plurality of second mask pillars 170 on the hard mask layer 110.

In some embodiments, each of the second mask pillars 170 is constituted by a remaining portion of the second spacer layer 150 disposed on the hard mask layer 110 and a remaining portion of the first upper layer 161 of the upper buffer mask layer 160 disposed on the remaining portion of the second spacer layer 150. In some embodiments, the forming the second spacer layer 150 may be omitted, and the each of the second mask pillars 170 is constituted a remaining portion of the first upper layer 161 of the upper buffer mask layer 160 disposed on the hard mask layer 110.

In some embodiments, the method of forming fine island patterns may further include removing the spacers 130 and the second spacer layer 150 after the etching the upper buffer mask layer 160 and before the etching the exposed portion of the substrate 100. In some embodiments, the removing the spacers 130 and the second spacer layer 150 may be performed by etching. In some embodiments, the forming the spacers 130 and/or the forming the second spacer layer 150 may be omitted, and the removing the spacers 130 and the second spacer layer 150 may be also omitted.

Figure 9A:
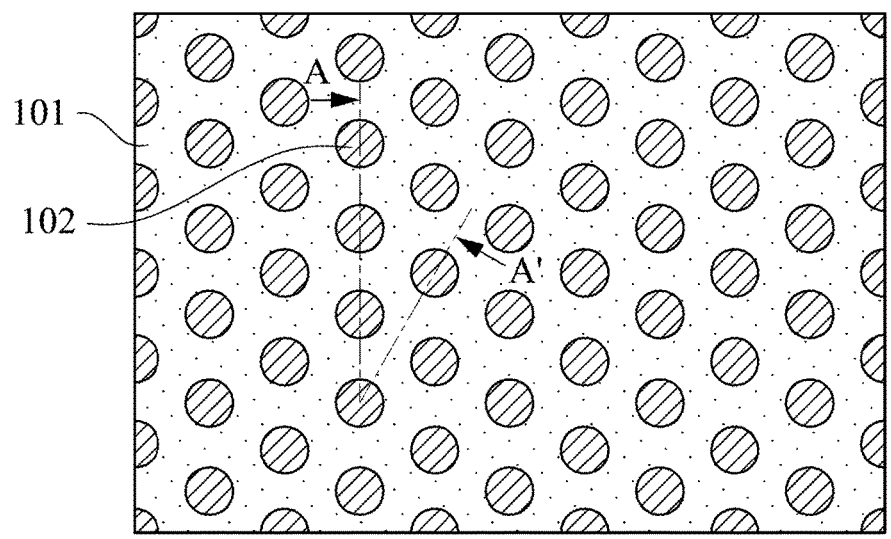
Figure 9B:
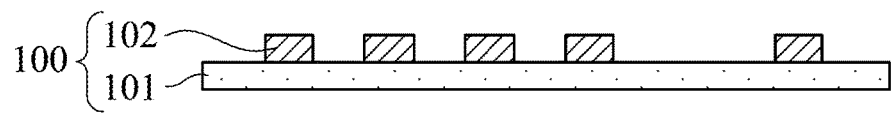

Reference is made to FIGS. 9A and 9B. In some embodiments, the method of forming fine island patterns may further include etching an exposed portion of the hard mask layer 110 exposed by the first mask pillars 140 and the second mask pillars 170 until portions of the substrate 100 are etched; and removing the first mask pillars 140, the second mask pillars 170, and remaining portions of the hard mask layer 110. In some embodiments, the removing the first mask pillars 140, the second mask pillars 170, and remaining portions of the hard mask layer 110 may be performed by etching.

In some embodiments, the substrate 100 may include a bottom layer 101 and a target layer 102 disposed on the bottom layer 101, and the etched portions of the substrate 100 are portions of the target layer 102. As a result, the remaining portions of the target layer 102 serve as fine island patterns on the bottom layer 101.

In some embodiments, the etching an exposed portion of the hard mask layer 110 may include etching the exposed portion of the hard mask layer 110 until portions of the bottom layer 101 are exposed.

According to the foregoing recitations of the embodiments of the disclosure, it can be seen that the fine island patterns formed by the various embodiments of the disclosure may have two times or more pattern density through multiple deposition/etching processes for mask pillars having a minimum pitch or a minimum diameter which can be formed by photolithography equipment. Therefore, degree of integration of the semiconductor devices may be improved and the fine island patterns may be stably formed by simple processes since advanced photolithography processes for forming fine island patterns may not be excessively used. In other words, the methods of forming fine island patterns of semiconductor devices according to various embodiments may provide formation of high density island patterns using one photolithography process and deposition and etch back processes of well-known materials without using high-priced semiconductor fabrication equipments, processes, and materials.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming fine island patterns, the method comprising:
    forming a plurality of first mask pillars on a hard mask layer on a substrate comprising:
        forming a lower buffer mask layer on the hard mask layer;
        forming a plurality of through vias in the lower buffer mask layer;
        filling the through vias with a mask material to form the first mask pillars; and
        removing the lower buffer mask layer; and
    forming an upper buffer mask layer over the hard mask layer to cover the first mask pillars;
    patterning a plurality of islands in the upper buffer mask layer;
    separating each of the islands into a plurality of sub-islands;
    etching the upper buffer mask layer to form a plurality of second mask pillars on the hard mask layer;
    etching an exposed portion of the hard mask layer exposed by the first mask pillars and the second mask pillars until portions of the substrate are etched; and
    removing the first mask pillars, the second mask pillars, and remaining portions of the hard mask layer.

2. The method of claim 1, wherein vertical projections of the islands on the hard mask layer are located among the first mask pillars.

3. The method of claim 1, wherein the forming the first mask pillars comprises:
    forming the first mask pillars based on a matrix constituting of a first dimension and a second dimension.

4. The method of claim 3, wherein the forming the first mask pillars comprises:
    equidistantly forming the first mask pillars based on the matrix.

5. The method of claim 4, wherein the patterning the islands comprises:
    patterning the islands based on a matrix constituting of the first dimension and a third dimension, wherein vertical projections of the islands on the hard mask layer and the first mask pillars are arranged along the first dimension and the third dimension.

6. The method of claim 5, wherein an angle between the first and second dimensions is about 60 degrees, an angle between the first and third dimensions is about 90 degrees.

7. The method of claim 5, wherein the separating comprises:
    making the sub-islands of each of the islands be arranged along the third dimension.

8. The method of claim 5, wherein a distance between adjacent two of the first mask pillars arranged along the third dimension is greater than a distance between adjacent two of the first mask pillars arranged along the first dimension.

9. The method of claim 1, further comprising:
    forming spacers on inner walls of the through vias before the filling.

10. The method of claim 9, further comprising:
    removing the spacers after the etching the upper buffer mask layer and before the etching the exposed portion of the hard mask layer.

11. The method of claim 9, wherein the forming the spacers comprises:
    forming a first spacer layer on a top surface of the lower buffer mask layer, the inner walls of the through vias, and a top surface of the hard mask layer; and
    removing portions of the first spacer layer on the top surfaces of the lower buffer mask layer and the hard mask layer to remain portions of the first spacer layer on the inner walls of the through vias.

12. The method of claim 9, further comprising:
    forming a second spacer layer on the hard mask layer to cover the first mask pillars and the spacers before the forming the upper buffer mask layer.

13. The method of claim 12, further comprising:
    removing the spacers and the second spacer layer after the etching the upper buffer mask layer and before the etching the exposed portion of the substrate.

14. The method of claim 1, further comprising:
    performing a planarization process to the first mask pillars with the lower buffer mask layer.

15. The method of claim 1, wherein the forming the upper buffer mask layer is performed by spin-coating.

* * * * *